United States Patent [19]

Lew

[11] Patent Number: 5,194,809
[45] Date of Patent: Mar. 16, 1993

[54] NMR-SCOPE

[76] Inventor: Hyok S. Lew, 7890 Oak St., Arvada, Colo. 80005

[21] Appl. No.: 574,766

[22] Filed: Jun. 30, 1990

[51] Int. Cl.⁵ ............................................. G01R 33/20
[52] U.S. Cl. ...................................... 324/309; 324/306
[58] Field of Search ............... 324/309, 307, 310, 306, 324/312, 318; 128/653 AF

[56] References Cited

U.S. PATENT DOCUMENTS

| 4,983,917 | 1/1991 | Le Roux | 324/309 |
| 4,993,414 | 2/1991 | Macovski et al. | 324/309 |
| 5,016,637 | 5/1991 | Koizumi et al. | 324/309 |

Primary Examiner—Louis Arana

[57] ABSTRACT

A diagnostic device comprises a magnet providing a nonalternating magnetic field with a gradient in a direction perpendicular to the nonalternating magnetic field, and a scope including a transmitter coil and a receiver coil with the central axes disposed parallel to the direction of the gradient in the nonalternating magnetic field, wherein a pulse of alternating current of a specific frequency with a specific duty cycle period generates a nuclear magnetic resonance emission from a test mass located at a specified distance from the scope, and analysis of the intensity of the nuclear magnetic emission so generated by certain procedures provides amounts of different molecular species making up the test mass, and the time rate of fluid change in the test mass.

9 Claims, 4 Drawing Sheets

NMR-SCOPE

BACKGROUND OF THE INVENTION

The application of nuclear magnetic resonance (NMR) technology in the medical field has been exclusively in the form of the well known magnetic resonance imaging, which provides images of a living body and/or spectroscopic information on the material constituents of parts in the living body. The magnetic resonance imaging is provided by constructing an array of NMR signals generated under a constant external magnetic field with gradients in three orthogonal directions by using a computer that identifies the intensity of the NMR signal originating from each voxel unit where three planes respectively perpendicular to the three orthogonal directions with gradients intersect and a computer builds an image by assigning the intensity of NMR signal to the voxel unit generating that intensity for all voxel units arranged in an array. As different elements of nonzero nuclear magnetic parity emits NMR signal at different frequencies under a given constant external magnetic field, the intensity of the NMR signal generated under a specific transmitter frequency corresponding to an atomic element species provides a measure of the abundance of that atomic element in the part of living body that is represented by the array of voxels. As a consequence, the magnetic resonance imaging machine operating in a form of a frequency sweep mode provides spectroscopic information on the constituents of a part of the living body. The modern magnetic radiation imaging machine is a wonderful tool that deserves to receive all the credits in technology and all the benefits fo financial reward. The only set back with the modern day magnetic resonance imaging machine is the extremely high cost and the heavy and bulky structure, which prevents magnetic resonance technology from being used on a very wide and extensive demographic distribution.

The principles of nuclear magnetic resonance can be applied to medical fields in other ways in addition to NMR imaging and spectroscopic analysis. More than ninety percent of living body is composed of hydrogen bearing molecules. Different molecular matters, i.e., water and various organic matters with varying degrees of saturation in fats, have different values of the relaxation time (particularly the spin-lattice relaxation time). By analyzing the intensity of the NMR signals generated from a localized part of the living body in the domain of relaxation time, the relative constituents making up that part of the living body can be determined. For example, the existence of abnormal amounts of water and fat, unsual masses of tissues, etc. as well as unhealthy proportions of matters comprising different parts of the living body, can be detected and scrutinized. In order to implement this concept of nuclear magnetic technology in medical application, firstly the transmitter-receiver units of the NMR package must be packaged in a compact and structurally detached form in such a way that it can be placed on the specific part of the surface of a living body to generate and receive NMR signal from the specific localized part of the living body and, secondly operating principles must be discovered and implemented that detects the intensities of individual components of NMR signals corresponding to different values of the relaxation time. It is also desired to device a method that generates and receives NMR signals exclusively from different parts of the living body having varying distances from the skin of the living body where the NMR transmitter-receive unit (NMR-scope) is located.

BRIEF SUMMARY OF THE INVENTION

The primary object of the present invention is to provide a NMR diagnostic device comprising a magnet providing a nonalternating magnetic field and an NMR-scope including a transmitter coil producing an alternating magnetic field and a receiver coil detecting NMR emission, wherein the NMR-scope is structurally detached from the structure supporting the magnet.

Another object is to provide a NMR diagnostic device employing a nonalternating magnetic field with a gradient in the direction perpendicular to the nonalternating magnetic field, wherein the NMR-scope generates and detects NMR signals from different masses located at different distances from the NMR-scope by varying the frequency of the alternating magnetic field.

A further object is to provide a NMR diagnostic device employing nonalternating magnetic field with a gradient in the direction perpendicular to the magnetic field and the magnet that includes a coil wound thereon energized by a variable direct current power supply, wherein the NMR-scope generates and detects NMR signals from different masses located at different distances from the NMR-scope by varying the amount of dc current energizing the coil.

Yet another object is to provide a NMR diagnostic device employing an uniform magnetic field, wherein the NMR-scope generates and detects NMR signals from different masses located at different distances by varying the duty cycle of the transmitter coil.

Yet a further object is to provide a NMR diagnostic device that determines the abundance of various molecular species containing elements such as hydrogen atoms and having different relaxation times of NMR signal decay from a combination of NMR signals generated by a series of pulses of alternating current energizing the transmitter coil with varying pause cycles between the pulses of the alternating current.

Still another object is to provide a NMR diagnostic device that determines the time rate of fluid change in a portion of a living body from NMR signals generated by a series of pulses of alternating current energizing the transmitter coil with pause cycles substantially smaller than the spin-lattice relaxation time of the fluid.

Still a further object is to provide a NMR diagnostic device comprising a U-shaped magnet providing a nonalternating magnetic field and, transmitter and receiver coils disposed intermediate the two poles of the magnet, which are packaged into a single unit in the form of a NMR-scope that operates on various principles mentioned in the preceding objects of the present invention.

These and other objects of the present invention will become clear as the description thereof progresses.

BRIEF DESCRIPTION OF THE FIGURES

The present invention may be described with a greater clarity and specificity by referring to the following figures.

DESCRIPTION OF THE ILLUSTRATED EMBODIMENTS

Figure 1:
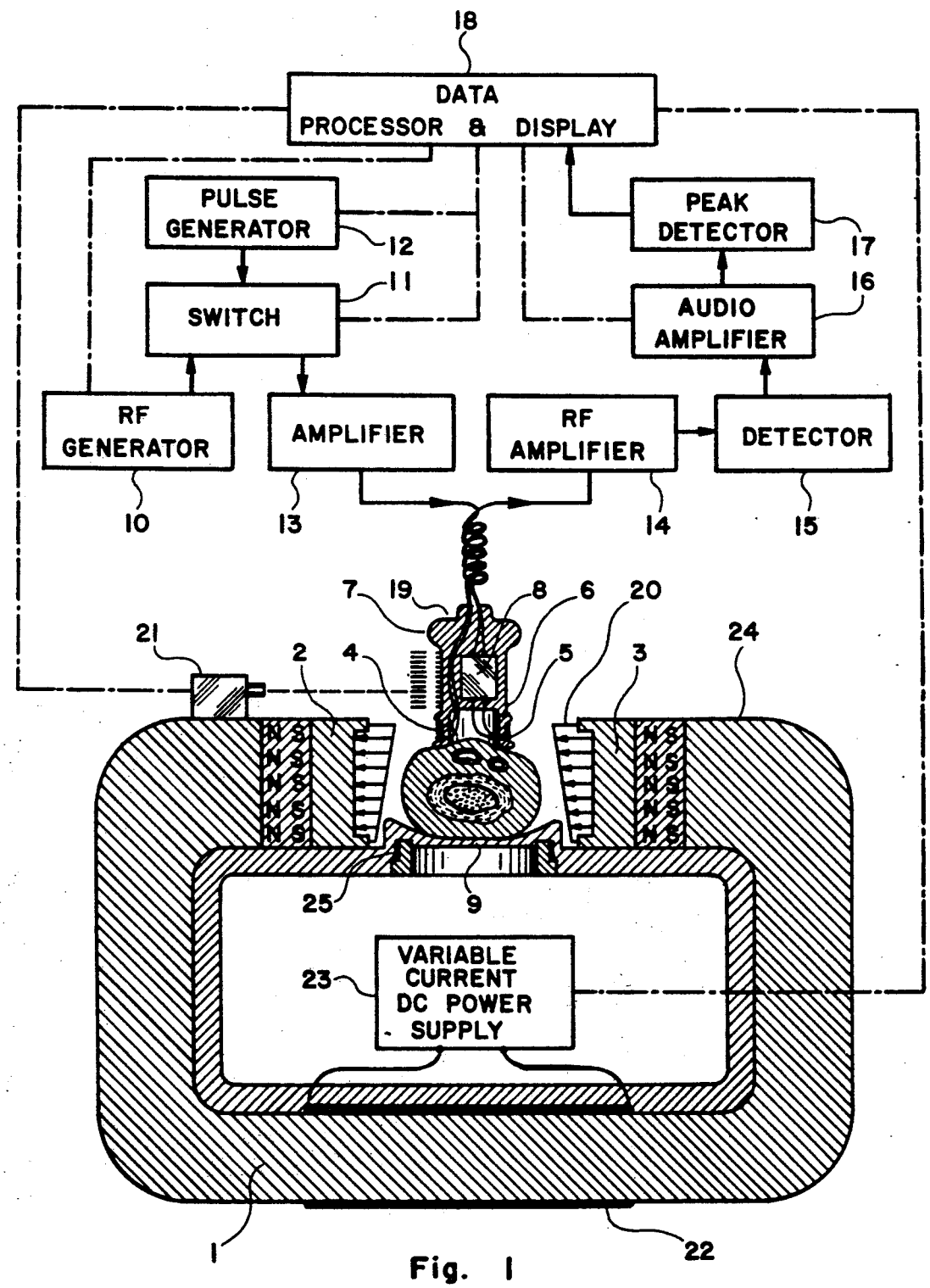
FIG. 1 illustrates an embodiment of the NMR-scope constructed in accordance with the principles of the present invention.

In FIG. 1 there is illustrated a cross section of an embodiment of the NMR-scope constructed in accordance with the principles of the present invention. The magnet 1 that may be a permanent magnet or an electromagnet with a direct current coil, provides a nonalternating magnetic field in space between two opposing poles 2 and 3 thereof, which nonalternating magnetic field may be uniform or have a gradient in a direction perpendicular to the direction of the magnetic field. The NMR-scope 4 includes transmitter coil 4 and receiver coil 5 coaxially wound on a circular cylindrical extremity 6 of the scope handle 7. The scope handle 7 may include a preamplifier 8 conditioning NMR signals picked up by the receiver coil 5. A table or tray 9 holding the sample under diagnosis may be included. The electronic transmitter unit energizing the transmitter coil 4 with a single or a series of alternating current pulses comprises a radio frequency alternating current supply 10, a switch 11 turning on and off the supply of the alternating current in a pulsed manner wherein the duty cycle and pause cycle are controlled by a pulse generator 12, and a radio frequency amplifier 13. The electronic receiver unit conditioning and amplifying the NMR signals picked up by the receiver coil 5 comprises a radio frequency amplifier 14, a detector 15 isolating the envelope of the radio frequency NMR signal, an audio amplifier 16 amplifying the envelope of the NMR signal, and a peak detector 17 measuring peak values of the envelope of the NMR signal. A data processor 18 analyzes the NMR signal and determines the absolute or relative abundance of the constituent molecular species making up the part of living body placed under the NMR-scope 19 and/or the time rate of fluid change therein. A typical diameter of the transmitter and receiver coils included in the NMR-scope 19 should be in the range of one quarter of an inch to six inches. The most preferable value of the transmitter and receiver coil diameters varies from one half inch to three inches depending on the type of diagnostic applications. In the actual assembly of the NMR diagnostic device of the present invention, the combination of the magnet 1 and table or tray 9 are packaged into a first structurally independent unit mounted on a cart with rollers or a table. The electronic transmitter and receiver units are packaged into a second structurally independent unit, whereto the data processor 18 may be incorporated structurally or connected electrically. The NMR-scope 19 is a third structurally independent unit connected to the second independent unit by a plurality of electrical cables.

In using the NMR-scope to determine the absolute or relative abundance of the constituent molecular species making up the part of the living body placed under the NMR scope as shown in FIG. 1 or to measure the time rate of fluid change therein, the NMR-scope must be positioned in such a way that the central axis of the transmitter and receiver coils is generally perpendicular to the magnetic force field. The nuclear magnetic resonance frequency of an atomic species as well as the molecular species bearing that atomic species is a unique value intrinsic to the product of the gyromagnetic ratio of that atomic species and the strength of the nonalternating magnetic field provided by the magnet 1. When a mass of matter is placed in a nonalternating magnetic field, the nuclei magnetons line up with the nonalternating magnetic force field for the same reason that a magnetic compass lines up with the earth's magnetic field. The time required to reach 63 percent of the state of maximum alignment of the nuclei magnetons starting from the neutral state is known as the "spin-lattice relaxation time". When the transmitter coil is energized with a pulse of alternating current oscillating at the nuclear resonance frequency, the alternating magnetic field generated by the transmitter coil tilt the nuclei magnetons lined up with the nonalternating magnetic force field towards a plane perpendicular to the nonalternating magnetic force field. A pulse of the RF current energing the transmitter coil, the tilts the nuclei magnetons aligned with the nonalternating magnetic force field to a plane perpendicular to the nonalternating magnetic force field is known as the "90 degree pulse" of RF current. As soon as the RF current energizing the transmitter coil is turned off, the nuclei magnetons tilted to the plane perpendicular to the nonalternating magnetic force field realign themselves to the nonalternating magnetic force field. The time required to lose the component of the nuclei magnetons perpendicular to the nonalternating magnetic force field by 63 percent starting from the fully tilted state is known as the "spin-spin relaxation" time. Of course, the nuclei magnetons line up with the nonalternating magnetic force field by 63 percent of the state of maximum alignment in "spin-lattice" relaxation time starting from the fully tilted state. In the process of transition following a spiral path from the fully tilted state to the state of maximum alignment, the nuclei magnetons emit electromagnetic radiation oscillating at the nuclear magnetic resonance frequency and decaying as an exponential function of time normalized by the spin-lattice relation time, that is known as NMR radiation or NMR emission. In actuality, the NMR emission decays much faster than the spin-spin relaxation time decay, because of the free-induction decay taking place at a rate much faster than the spin-spin relaxation time decay. The spin-spin relaxation time decay can be obtained by a method known as spin-echo, which involves application of a series of 180 degrees pulses. The peak value of the maximum value taking place at the on-set of the NMR emission of a NMR frequency is proportional to the abundance of the atomic or molecular species of that NMR frequency making up the sample mass placed under the NMR-scope. Therefore, the absolute or relative abundance of that atomic or molecular species can be determined from the measured peak value of the NMR signal. A method for an in-depth analysis of the NMR signal for the diagnostic purpose is described in conjunction with FIGS. 5, 6, 7, 8, 9, 11 and 12.

There are two different ways to generate an NMR emission from different sample masses located at different distances from the NMR-scope. The first method employs the nonalternating magnetic field with a gradient 20 in a direction parallel to the central axis of the transmitter and receiver coil. As the strength of the nonalternating magnetic field varies as a function of distance from the NMR-scope, different RF NMR frequencies employed in energizing the transmitter coil 4 generates NMR emission from different masses of the sample located at different distances from the NMR-scope. For each NMR frequency, the power delivered to the transmitter coil 4 in the form of a 90 degree pulse may be varied by varying the value of the duty cycle period and/or by varying the amplitude of the RF current in such a way that the maximum producible NMR signal is obtained from different masses in the sample located at different distances from the NMR-scope. As the distance from the receiver coil 5 to the mass in the sample under diagnosis increases, the NMR signal emitted from that mass and actually picked up by the receiver coil 5 decreases in intensity. In order to compensate for this deviation preventing the detection of the true intensity of the NMR signal, the amplifier included in the receiver electronics package must have variable amplification means that automatically compensate for the effect of distance from the sample mass to the receiver coil. Each NMR frequency of different NMR frequencies employed represents a different position relative to the magnet along a direction perpendicular to the nonalternating magnetic force field, while the positions of various masses in the sample measured from the NMR-scope are the positions required by and useful for the diagnostic purpose. The position sensor 21 measures the position of the NMR-scope relative to the magnet. The data processor converts different values of the NMR frequencies to different values of the positions of the sample masses measured from the NMR-scope by using the data supplied by the position sensor 21. Due to the changing temperature and aging of the permanent magnet, the strength of the nonalternating magnetic field can weaken. The electromagnetic coil 22 energized by a variable current dc power supply 23 boosts the nonalternating magnetic field to the strength that provides the maximum producible NMR signal under a preset series of NMR frequencies. The above-mentioned mode of operation can be incorporated into a computerized automatic operating sequence, which operates in the following way: The diagnostic process commences by placing the NMR-scope at a "reference position" such as a position whereat the bottom end of the NMR scope is flush to the top surface 24 of the magnet 1 and turning on the "START" switch that sets the NMR frequency to a "reference frequency", which setting automatically sets the dc current supplied to the electromagnetic coil 22 to an optimum value that generates the maximum producible NMR signal, as the amount of dc current is controlled by the feed back from the peak detector 17. This initial setting simply brings up the strength of the nonalternating magnetic field to a "design strength", where at the NMR diagnostic device is designed to operate in accordance with a pre-programmed procedure, wherein different NMR frequencies represents different distances relative to the reference position 24 on the magnet, and each of different NMR frequencies has its own value of power delivered to the transmitter coil in pulsed form, that generates the maximum producible NMR signal from the sample mass, and its own NMR peak value correction factor, which cancels out the effect of distance between the NMR-scope and the sample mass under diagnosis when that correction factor is applied to the peak value of NMR signals measured by the peak detector. Upon placing the NMR-scope on top of the skin of a living body under diagnosis and turning on a "READY" switch, the computer converts the position of the sample mass relative to the reference position on the magnet 1 to the position relative to the NMR-scope, while matched values between the NMR frequency, the amount of power input contained in the 90 degree pulse and the NMR peak value correction factor remains unchanged. Upon turning on a "MEASURE" switch, NMR data are taken from different masses of the sample located at different distances from the NMR-scope in an automatic sweep mode in distance, or in a manual mode taking data from one or more sample masses designated in terms of distances from the NMR-scope to those designated sample masses. Once data is taken in the desired mode and stored in the computer memory included in the data processor 18, these datum are analyzed to obtain the information described in conjunction with FIGS. 7, 8 and 9, or 10, 11, 12 and 13. The second method employs a uniform nonalternating magnetic field and a single fixed NMR frequency, wherein different sample masses located at different distances from the NMR-scope are energized by varying the amount of power delivered to the transmitter coil in the form of 90 degree RF current pulses. Of course, for each value of the power included in the 90 degree pulse, a corresponding value of the distance from the NMR-scope to the mass in the sample, and the NMR peak value correction factor are employed. The combination of the electromagnetic coil 22 and the variable current dc power supply 23 may be included to maximize the NMR signals. The operating sequence for the second method can be set up essentially the same as that for the first method with the exception of procedure related to the "START" switch that is now omitted. The advantage of the second method over the first method is the elimination of the position sensor 21 and software in the computer program related thereto, while the disadvantage of the second method is the poor resolution in differentiating the different masses in the sample located at different distances from the NMR-scope. It should be mentioned that the transmitter coil 4 may be replaced by a new transmitter coil 25 disposed within the sample table or tray 9 in a coaxial arrangement to the receiver coil 5. It should be understood that the magnet 1 can be a 100 percent electromagnet energized by the dc current coil 22 instead of the combination of the permanent magnet and the electromagnet shown in the particular embodiment.

Figure 2:
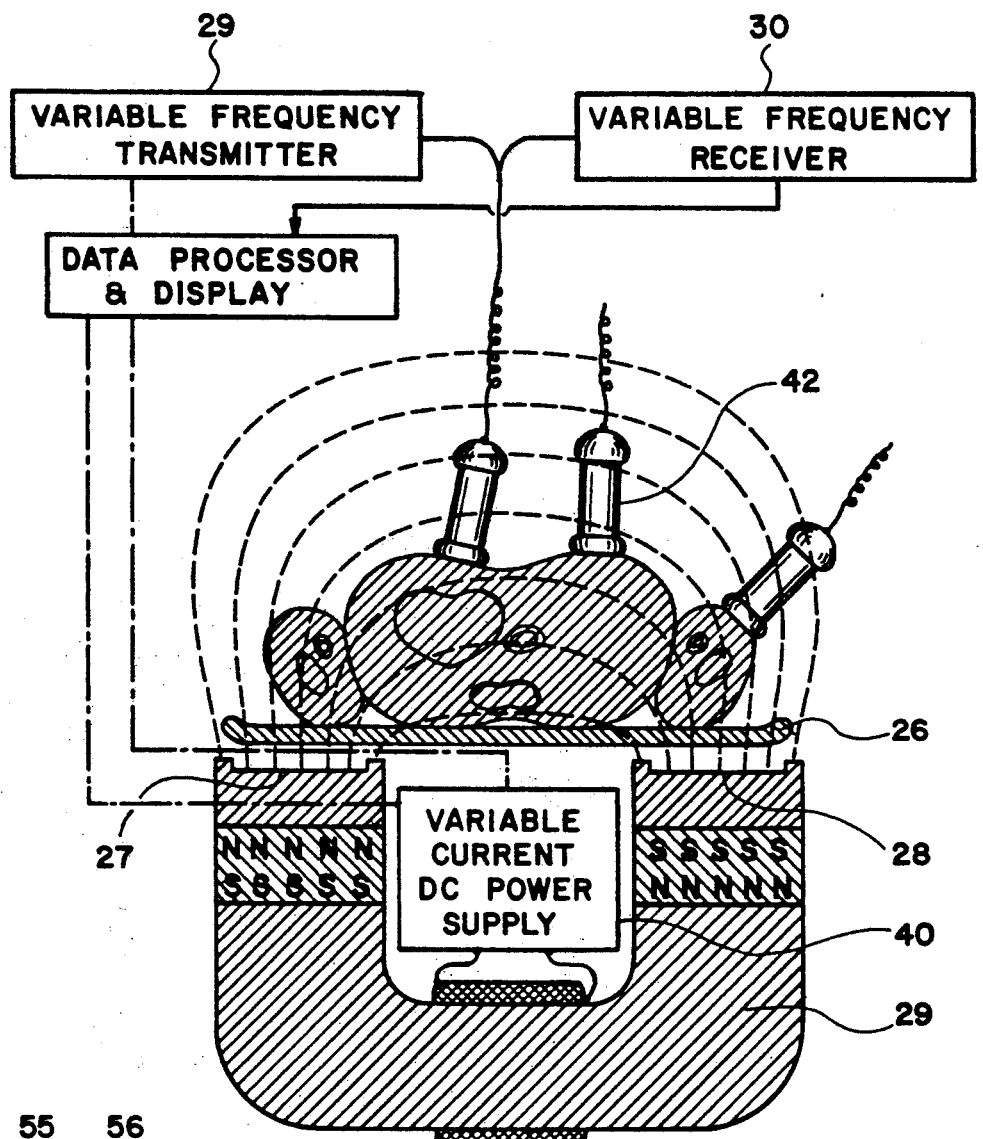
FIG. 2 illustrates another embodiment of the NMR-scope of the present invention.

In FIG. 2 there is illustrated a cross section of another embodiment of the NMR diagnostic device that operates on the same principles and methods as those of the embodiment shown in FIG. 1. While the test section above the sample table or tray 9 included in the embodiment shown in FIG. 1 is located between two magnetic poles of opposite polarities disposed in a face-to-face arrangement, the test section of this particular embodiment is located above the table or tray 26 disposed above a plane commonly including the two magnetic poles 27 and 28 of opposite polarities included in the magnet 29. The transmitter electronics 29 including the RF generator, switch, pulse generator and RF amplifier, and the receiver electronics 30 including the RF amplifier, detector, audio amplifier and peak detector as shown in FIG. 1, and the combination of the variable current dc power supply and the electromagnetic coil 41 play the same role as those described in conjunction with FIG. 1. This particular embodiment operates only in the first method described in conjunction with the operating principles of the embodiment shown in FIG. 1, as there is no easy way to provide an uniform nonalternating magnetic field by the U-shaped or horse shoe type magnet 29. As there is no reference position universally providing a reference plane, from which the distance to the NMR-scope 42 can be measured and meaningfully quantified, the device must be tuned for each different location of the NMR-scope 42 placed above the skin of the sample, which involves controlling the dc current energizing the electromagnetic coil 41 to the value that generates the maximum producible NMR signal. The embodiment shown in FIG. 2 provides a NMR diagnostic device that is more compact but less accurate than the embodiment shown in FIG. 1.

Figure 3:
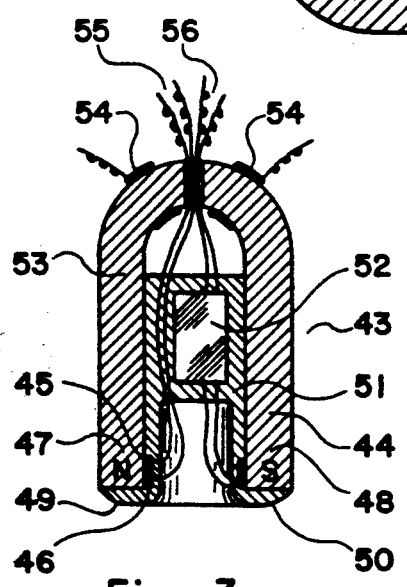
FIG. 3 illustrates a further embodiment of the NMR-scope of the present invention.

In FIG. 3 there is illustrated a cross section of a further embodiment of the NMR diagnostic device of the present invention, wherein the NMR-scope 43 includes the U-shaped or horse shoe type magnet 44 in addition to the transmitter coil 45 and the receiver coil 46 disposed coaxially about an axis of axisymmetry of the magnet 44. One end of the transmitter coil 45 and one end of the receiver coil 46 are generally flush to the end faces of the two magnetic poles 47 and 48 of opposite polarities, which faces are disposed on a common plane perpendicular to the central axis of the transmitter and receiver coils disposed intermediate the two magnetic poles 47 and 48. The end faces of the two magnetic poles 47 and 48 are covered with angled extensions 49 and 50 of the coil support member 51 fitted between and affixed to the two legs of the U-shaped magnet, which coil support member 51 also holds the preamplifier conditioning NMR signals picked up by the receiver coil 46. The magnet 53 with two magnetic poles 47 and 48 may be a permanent magnet with a boost electromagnetic coil 54 as shown in the particular embodiment, or an all electromagnet energized solely by the electromagnetic coil 54. The NMR-scope shown in FIG. 3 is electrically connected to the electronic devices shown in FIG. 1 by a plurality of flexible cables. For example, the cables 55 extending from the transmitter coil 45 is connected to the transmitter electronics including the RF generator 10, switch 11, pulse generator 12, and the RF amplifier 13 as shown in FIG. 1, while the cables 56 extending from the preamplifier 52 is connected to the receiver electronics including the RF amplifier 14, detector 15, audio amplifier 16 and peak detector 17 as shown in FIG. 1. The electromagnetic coil 54 is energized by dc current supplied by a variable current dc power supply such as the element 23 shown in FIG. 1.

As the strength of the nonalternating magnetic field provided by the U-shaped or horse shoe type magnet 53 decreases as the distance increases from the reference plane including the faces of the magnetic poles 47 and 48, different NMR frequencies must be employed to generate NMR signals from different masses in the sample located at different distances from the reference plane. The operating principles of this embodiment of the NMR diagnostic device is quite similar to the first mode of operation of the embodiment shown in FIG. 1. Upon placing the NMR-scope on top of the skin of a sample, the "START" switch is turned on, which action generates the "reference NMR frequency" and the "reference power input" delivered to the transmitter coil 45 in the form of the 90 degree pulse of RF current of frequency equal to the "reference NMR frequency" and supplies the optimum amount of dc current to the electromagnetic coil 54 that maximizes the NMR signal generated by the "reference NMR frequency" and the "reference power in the 90 degree pulse". In other words, switching on of the "START" switch establishes the nonalternating magnetic field to the exact strength of the design value. Under the nonalternating magnetic field of the design value, the computer included in the data processor has a preprogrammed relationship between different NMR frequencies and different distances from the reference plane to different test masses in the sample, as well as each combination of the "power included in the 90 degree pulse" and "the peak value correction factor" eliminating the effect of the distance between the test mass in the sample and the receiver coil, which combination is matched to each NMR frequency. Upon switching on the "MEASURE" switch, a series of measurements with different NMR frequencies are carried out in an automatic sweep mode, which measures and records a series of peak values of NMR emissions emitted from different test masses in the sample located at different distances from the reference plane, or measurements are made for one or more manually selected frequencies corresponding to test masses in the sample located at desired distances from the reference plane. The date collected and stored in the computer included in the data processor are analyzed by methods described in conjunction with FIGS. 7, 8 and 9, or 11, 12 and 13.

Figure 4:
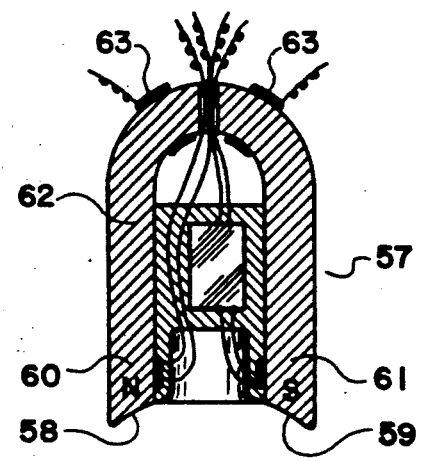
FIG. 4 illustrates yet another embodiment of the NMR-scope of the present invention.

In FIG. 4 there is illustrated a cross section of yet another embodiment of the NMR diagnostic device that comprises the self-sufficient NMR-scope having the same construction as the NMR-scope 43 shown in FIG. 4 with one exception, that is the concave end faces 58 and 59 of the two magnetic poles 60 and 61 of opposite polarities included in the magnet 62 with the boost electromagnetic coil 63. This NMR-scope operates on the same principles as those described in conjunction with FIG. 4. The concave end face of the NMR-scope 57 is particularly adapted to placing the NMR-scope on top of the curved surface of the test sample such as the head, limb and curved portion of the torso in a living body. The NMR-scopes shown in FIGS. 3 and 4 are truly versatile and effective diagnostic devices as they can be easily transported and readily applied to specific body parts of a living body.

Figure 5:
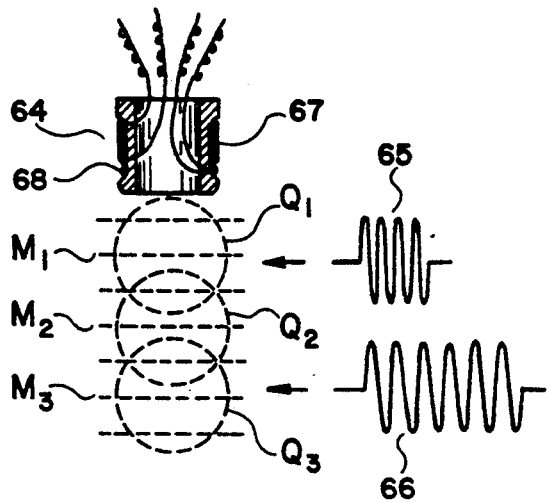
FIG. 5 illustrates a mode of the operating principles of the NMR-scope.

In FIG. 5 there is illustrated a schematic diagram explaining why and how different NMR frequencies represents the different test masses of the sample located at different distances from the NMR scope 64. The nonalternating magnetic field has strength $M_1$, $M_2$, $M_3$,—etc. progressively decreasing as the distance from the NMR-scope 64 to the location of each test mass progressively increases. Since the NMR frequency of a given atomic species is directly proportional to the strength of the nonalternating magnetic field, RF energies applied to the test masses in the form of 90 degree pulses of RF current with NMR frequencies $F_1$, $F_2$, $F_3$,—etc. will energize test masses $Q_1$, $Q_2$, $Q_3$,—etc. respectively. In other words, a higher NMR frequency 65 energizes a test mass $Q_1$, while a lower NMR frequency 66 energizes a test mass $Q_2$. The amount of energy actually delivered to different test masses by a pulse of RF current with a given duty cycle period energizing the transmitter coil 67 decreases as the distance from the transmitter coil to different test masses increases. Therefore, the duty cycle period of the RF current applied in pulses, that tilts the aligned nuclei magnetons over 90 degrees must be greater for a test mass $Q_3$ located at a greater distance from the transmitter coil 67, and smaller for a test mass $Q_1$ located at a shorter distance from the transmitter coil when the RF current has a fixed amplitude, or the amplitude of the RF current must be varied when the RF current is delivered to the transmitter coil 67 in a pulse with a fixed duty cycle period. For example, the 90 degree pulse 65 energizing a test mass $Q_1$ has a shorter duty cycle period including RF current of a higher NMR frequency, while the 90 degree pulse 66 energizing a test mass $Q_3$ has a longer duty cycle period including RF current of a lower NMR frequency. As the distance between the receiver coil 68 and a test mass increases, the portion of NMR emission from that test mass picked up by the receiver coil 68 decreases. Therefore, the peak value of the NMR emission picked up by the receiver coil 68 must be multiplied by an appropriately assigned value of the peak value correction factor, whereby peak values of NMR signals emitted from different test masses located at different distances from the receiver coil 68 and picked up by the receiver coil 68 are brought up to mutually comparable values. The above-mentioned analysis of events taking place in the physical system shown in FIG. 5 can be summarized as follows: For each of the different distances to different test masses in the sample from the NMR-scope, each set of NMR frequencies, amounts of energy supplied to the transmitter coil (or example, duty cycle period of the 90 degree pulse) and the peak value correction factors, which combination brings up the NMR data taken from different test masses in the sample to maximum producible values on an equal basis, must be assigned. The relationship between the position of individual test masses and corresponding values of the NMR frequencies, duty cycle periods of the 90 degree pulse and the peak value correction factors must be determined empirically for all test masses by using a calibration test sample of homogeneous constitution (corrected peak values of NMR signals from all test masses in the homogeneous test sample must be the same), and stored in a computer that automatically selects appropriate values of those NMR variables when a distance from a test mass in the sample to the NMR-scope is selected as an independent or input variable. The description of the physics provided by the preceding paragraph explains the physics foundation constituting the basis of the operation of the NMR diagnostic devices shown in FIGS. 2, 3 and 4 and the first mode of operation of the NMR diagnostic device shown in FIG. 1.

Figure 6:
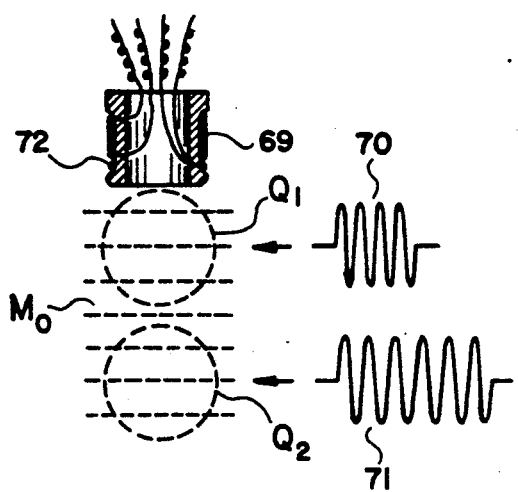
FIG. 6 illustrates another mode of operation of the NMR-scope.

In FIG. 6 there is illustrated a schematic diagram explaining the basis of the operating principles of a NMR diagnostic device employing an uniform nonalternating magnetic field such as the second mode of operation of the NMR diagnostic device shown in FIG. 1. As the nonalternating magnetic field has a uniform strength $M_0$ everywhere, the NMR frequency $F_0$ of a constant value is applicable to all test masses in the sample. As mentioned in conjunction with FIG. 5, different pulses of RF current with the NMR frequency energizing the transmitter coil 69 must have different duty cycle periods in order to energize different test masses located at different distances from the transmitter coil 69, as exemplified by the 90 degree pulse 70 with a shorter duty cycle period energizing a test mass $Q_1$ and the 90 degree pulse 71 with a longer duty cycle period energizing a test mass $Q_2$. Of course, the peak values of NMR signals picked up by the receiver coil 72 must be corrected by multiplying the peak value correction factor thereto in order to bring them to a mutually comparable level for the same reason described in conjunction with FIG. 5. In summary, for each value of different distances to different test masses in the sample from the NMR-scope, each set of the amounts of energy supplied to the transmitter coil (for example, the duty cycle period of the 90 degree pulse) and the peak value correction factors must be assigned. The relationship between the position of the individual test mass and corresponding values of duty cycle period of the 90 degree pulse and the peak value correction factor must be determined empirically for all test masses by using a calibration test sample of homogeneous constitution (corrected peak values of NMR signals from all test masses in the homogeneous test sample must be the same), and stored in a computer that automatically selects appropriate values of those NMR variables when a distance from a test mass in the sample to the NMR-scope is selected as an independent or input variable. The preceding paragraph explains the physics foundation constituting the basis of the second mode of operation of the NMR diagnostic device shown in FIG. 1.

Figure 7:
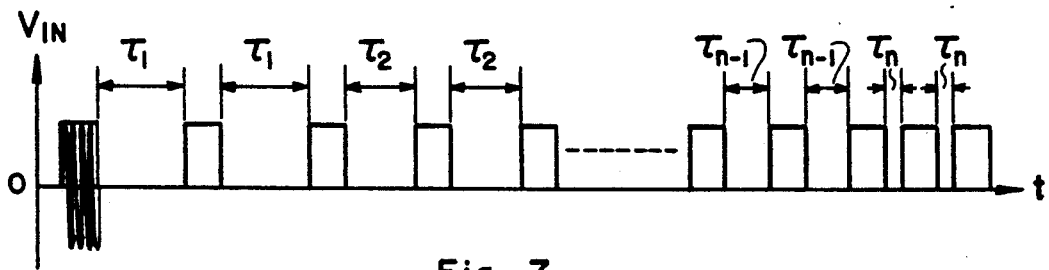
FIG. 7 illustrates a series of alternating current pulses energizing the transmitter coil included in the NMR-scope with varying pause cycles, which generates a combination of NMR signals dependent upon the relaxation times of the individual NMR signals.
Figure 8:
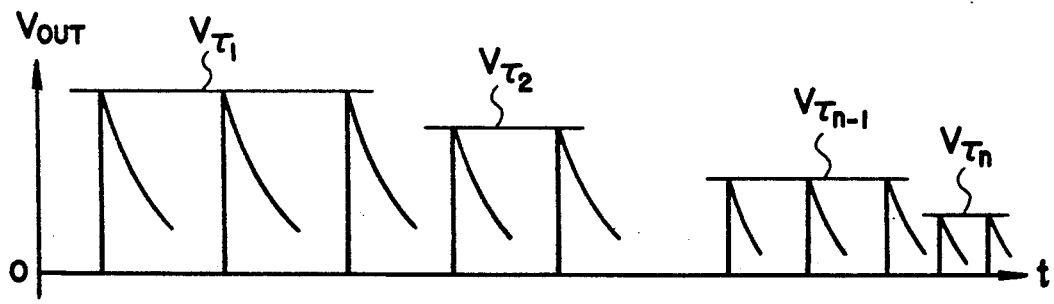
FIG. 8 illustrates a series of individual NMR signals generated by the series of alternating current pulses shown in FIG. 7.
Figure 9:
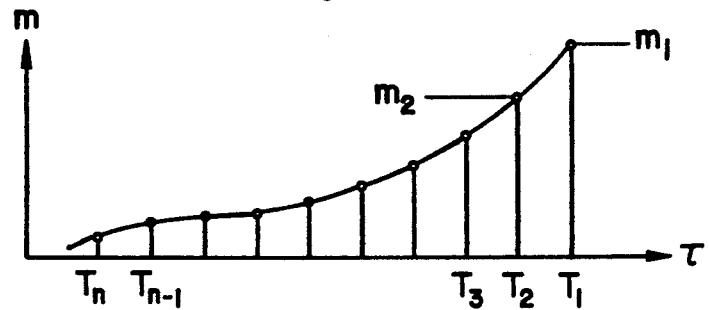
FIG. 9 illustrates the distribution of the peak values of the individual NMR signals plotted versus the pause cycle time, from which the abundance of each molecular species in the mass under diagnosis is determined.

In FIGS. 7, 8 and 9, there is illustrated a first method of diagnosis with the NMR-scope of the present invention, that determines the absolute or relative abundance of different molecular species commonly containing a specific atomic species of nonzero parity such as the hydrogen atom. As explained during the description of the physics of NMR phenomenon in conjunction with FIG. 1, it takes a time interval at least comparable to or greater than the spin-lattice relaxation time inherent to the specific atomic species contained in the molecular species to have their atomic nuclei magnetons aligned to the nonalternating magnetic force field starting from a state where the atomic nuclei magnetons are randomly oriented as in the case of the molecular species existing in a nonmagnetic ambient surrounding or the molecular species with aligned atomic nuclei magnetons under a nonalternating magnetic field, which aligned atomic nuclei magnetons are tilted to a plane perpendicular to the nonalternating magnetic field by a 90 degree pulse of RF current oscillating at the NMR frequency and energizing the transmitter coil in the NMR-scope. The degree of realignment or remagnetization of the atomic nuclei magnetons after being scrambled by a 90 degree pulse is given by equation $$\mu = \mu_0 (1 - e^{-t/T_1}), \quad (1)$$

where $\mu$ is the magnetization, $\mu_0$ is the maximum value of $\mu$ atainable, e is the base of natural logorithm, $T_1$ is the spin-lattice relaxation time intrinsic to specific molecular species, and t is the time measured from the completion of delivery of a 90 degree pulse or from the moment the molecular species is abruptly subjected to the nonalternating magnetic field. It becomes clear from equation (1) that a series of 90 degree pulses with pause cycle periods substantially less than the spin-lattice relaxation time $T_1$ scrambles the atomic nuclei magnetons and, consequently, no NMR signal is emitted from the molecular species scrambled by a series of rapid 90 degree pulses. In general, different parts of the living body are made of various molecular species containing hydrogen atoms, such as water, unsaturated fat, saturated fat, protein, etc., each of which molecular species has its own relaxation time. For example, the relaxation time of water is equal to 2-3 seconds; that of nonsaturated fat is equal to 200-300 milliseconds; that of saturated fat is 30-50 milliseconds; and that of protein is a few milliseconds. When a series of 90 degree pulses are delivered to the transmitter coil at a pause cycle period of 10-20 milliseconds, NMR signals emitted from a part of living body under the NMR-scope are mostly generated by the proteins in the sample and the peak value of such NMR signals provides a measure of abundance of protein in the sample. The absolute amount of protein existing in the sample can be determined from the peak value of the NMR signals by using a empirically obtained relationship therebetween. When a series of 90 degree pulses, with pause cycle times equal to about 100 milliseconds, is applied, the peak values of NMR signals provides a measure of the abundance of the protein and saturated fat. By substracting the portion of the NMR signal peak value contributed by protein from the total peak value based on an empirically established relationship, the net peak value contributed by the fat is obtained, which net peak value determines the absolute amount of the fat existing in the sample by using an empirically obtained relationship.

The peak values of the maximum producible NMR emissions from various constituent molecular species contained in a test mass, wherein the amounts of various constituent molecular species contained in the test mass are directly proportional to the peak values of the maximum producible NMR emissions respectively emitted therefrom, can be determined in the following method: When there are n different species of constituent molecular species in a test mass respectively having the magnetic relaxation time $T_i$, n different values $\tau_i$ distributed in magnitude between the largest value $T_1$ and the smallest value $T_n$ of the magnetic relaxation times of all constituent molecular species, are more or less arbitrarily selected to produce a series of 90 degree pulses having n different pause cycle periods $\tau_i$ included therein as shown in FIG. 7. One of the best way to select n different values $\tau_i$ is to use the magnetic relaxation times $T_i$ of the constituent molecular species for $\tau_i$. By energizing the transmitter coil by a series of 90 degree pulses with pause cycle period $\tau_i$ and measuring the peak value $V\tau_i$ for i=1, 2, 3,—n, one obtains a system of simultaneous linear algebraic equations inclusing n different equations and n different unknowns $V_i$ $$\sum_{i=1}^{n} V_i(1 - e^{-\tau_j/T_i}) = V\tau_j, \text{ for } j = 1, 2, 3, \cdots n, \quad (2)$$

where $V_i$ stands for the peak value of the maximum producible NMR signal emitted from $i^{th}$ constituent molecular species in the test mass. The magnetic relaxation time $T_i$ have known values as they have well known values determined empirically by laboratory testings and published. $\tau_j$ have known values since they are assigned parameters. $V\tau_j$ are known because they are measured peak values of NMR emissions respectively generated by a series of 90 degree pulses with pause cycle period $\tau_j$. Therefore equations (2) can be readily solved for $V_i$. The amount of the individual constituent molecular species is determined by equation $$m_i = C_i V_i, \, i = 1, 2, 3-n, \quad (3)$$

where $C_i$ is a constant of proportionality having empirically determined known value. In actual operation, the arithmetics involved in equations (2) and (3) can be carried out by using a computer, that with stored values $T_1, T_2, T_3, -T_n$, receives a set of input data $V\tau_1, V\tau_2, V\tau_3, -V\tau_n$ shown in FIG. 8, which are generated by a series of pulses with progressively varying pause cycle periods $\tau_1, \tau_2, \tau_3, -\tau_n$ shown in FIG. 7, that is applied in a single sweep. The same computer can plot the values $m_i$ versus $T_i$ as shown in FIG. 9, which curve shows the mass distribution of the constituent molecular species in the magnetic relaxation time domain. The above-mentioned analysis can be carried out for different portions of the test mass located at different distances from the NMR-scope as the NMR-scope of the present invention has the ability to select a specific portion of the test mass.

Figure 10:
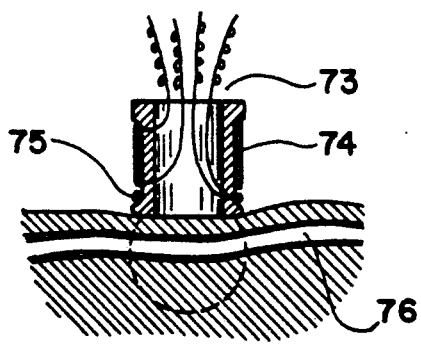
FIG. 10 illustrates a NMR-scope employed in the measurement of the time rate of fluid flow in a living body adjacent to the NMR-scope.
Figure 13:
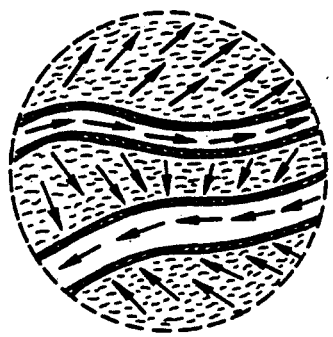
FIG. 13 illustrates a picture of fluid change in a tissue mass of a living body, wherein the time rate of fluid change is measured by the NMR-scope.

In FIG. 10 there is illustrated the NMR-scope 73 with a transmitter coil 74 and the receiver coil 75 employed in a second method of diagnosis, that determines velocity of the fluid moving through a blood vessel 76, or time rate of fluid change in a tissue mass depicted in FIG. 13.

Figure 11:
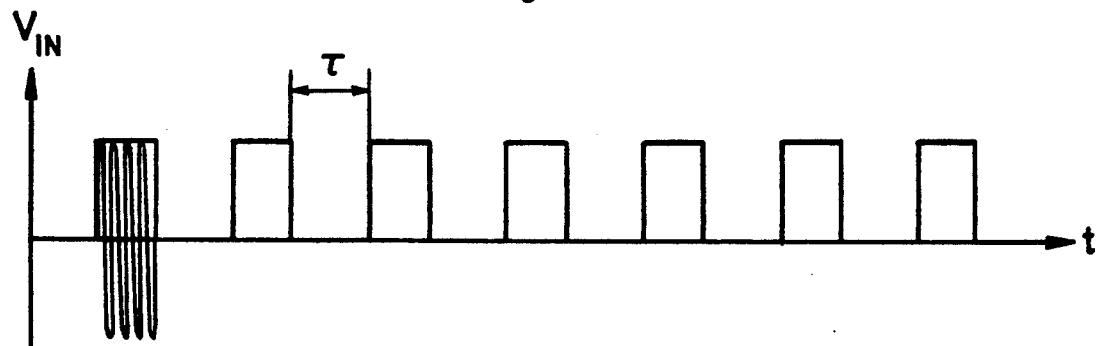
FIG. 11 illustrates a series of alternating current pulses energizing the transmitter coil included in the NMR-scope in measuring the fluid flow, which alternating current pulses are applied at pause cycles much smaller than the spin-lattice relaxation time of the fluid.
Figure 12:
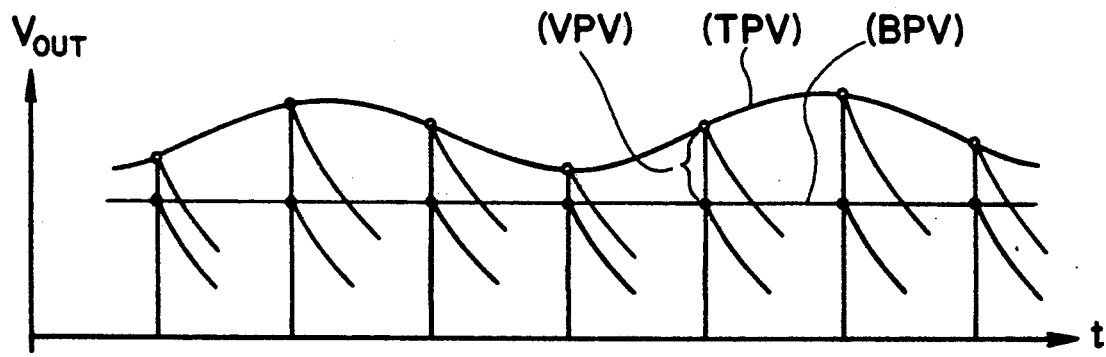
FIG. 12 illustrates a series of individual NMR signals generated from the moving fluid and the stationary tissue by the series of alternating current pulses shown in FIG. 11.

In FIGS. 11 and 12, there is illustrated the operating principles of the NMR diagnostic device of the present invention in measuring the fluid velocity or time rate of fluid change. As mentioned earlier in a discussion in conjunction with FIGS. 7, 8 and 9, it was mentioned that water has $T_1$ relaxation time equal to 2-3 seconds, and that, when the transmitter coil is energized with a series of 90 degree pulses with pause cycle periods much less than $T_1$ relaxation time, the atomic nuclei magnetons become scrambled and, consequently, no NMR signal is emitted. When the transmitter coil 74 in the NMR-scope shown in FIG. 10 is energized by a series of 90 degree pulses with a pause cycle period equal to or less than 30 millisecond, no NMR signal is generated by water at stationary positions. When water with aligned hydrogen nuclei magnetons freshly moves into a region under the influence of the series of rapidly fixed 90 degree pulses, this moving mass of water emits one NMR pulse with a peak value proportional to the velocity of water before it becomes scrambled by the rapidly fired 90 degree pulses. In general, a series of 90 degree pulses with pause cycle time/less than or equal to 20-30 milliseconds shown in FIG. 11, that energizes the transmitter coil in the NMR-scope generates a series of NMR signals as shown in FIG. 12, where the "total peak value" (TPV) is the sum of the "background peak value" (BPV) of NMR emission generated by the fat and protein tissues in the tissue masses under the NMR-scope, and the "velocity peak value" (VPV) of NMR signal generated by the moving fluid. The fluid velocity U is determined from the "velocity peak value" by equation $$U = G \cdot (VPV), \quad (4)$$

where G is a constant of proportionality, which is determined empirically. If the blood vessel is a small artery or small vein, the "background peak value" (BPV) can be measured by taking the NMR data after blocking the blood flow to the vessel under test momentarily by occluding the blood vessel by compression or tourniquet. Once (BPV) is obtained, equation (4) written in the following form provides the value of the fluid velocity U:

$$U = G \cdot [(TPV) - (BPV)]. \quad (5)$$

If the value of (BPV) cannot be taken by an occlusion method, the value of (BPV) may be obtained by the following method: Firstly, select a value of the pause cycle period $\tau_U$ that generates (TPV) sensitively changing as a function of the fluid velocity U. It should be understood that $\tau_U$ of a smaller value must be employed in measuring higher values of the velocity U, and $\tau_U$ of a larger value must be employed in measuring lower values of the velocity U as (TPV) dependence on U reaches a plateau when the velocity U exceeds an appropriate range dictated by the selection of a value for $\tau_U$. Secondly choose another value $\tau_B$ substantially smaller than $\tau_U$, which generates (TPV) of more or less a constant value independent of the fluid velocity U, and obtain the total peak value $(TPV)_B$ generated by the rapidly fired 90 degree pulse with pause cycle period $\tau_B$. The background peak value (BPV) is obtained by equation $$(BPV) = K \cdot (TPV)_B, \quad (6)$$

where K is a constant of proportionality determined empirically from a laboratory sample of the background tissues equivalent to the living tissue surrounding the blood vessel. Substitution of value of (BPV) obtained from equation (6) and the measured value of (TPV) with rapidly fired 90 degree pulses with pause cycle time $\tau_U$ into equation (5) provides the fluid velocity U.

In FIG. 13 there is illustrated a cross section of tissue mass under the NMR-scope, which cross section is taken along a plane perpendicular to the axis of the transmitter and receiver coils in the NMR-scope. When there are a multitude of blood vessels in the tissue mass under diagnosis, the velocity U given by equation (5) or (6) provides the time rate of fluid change in the tissue mass instead of velocity of blood.

While the principles of the present inventions have now been made clear by the illustrative embodiments, there will be many modifications of the structures, arrangements, proportions, elements and materials, which are obvious to those skilled in the art and particularly adapted to the specific working environments and operating conditions in the practice of the invention without departing from those principles. It is not desired to limit the inventions to the particular illustrative embodiments shown and described and accordingly, all suitable modifications and equivalents may be regarded as falling within the scope of the inventions as defined by the claims which follow.

The embodiments of the invention, in which an exclusive property or priviledge is claimed, are defined as follows:

1. A method for determining time rate of fluid change taking place in a test mass, comprising in combination:

a) placing a test mass within a nonalternating magnetic field encompassing and including a region occupied by the test mass, and aligning nuclear magnetic moments of atomic species contained in the fluid parallel to the nonalternating magnetic field;

b) imposing a series of pulses of alternating magnetic field oscillating at nuclear magnetic resonance frequency of the atomic species and oriented in directions substantially perpendicular to the nonalternating magnetic field in such a way that nuclear magnetic resonance phenomena created by said alternating magnetic field is substantially limited to a region substantially occupied by the test mass wherein each of said pulses of alternating magnetic field tilts the aligned nuclear magnetic moments over a sizable angle between 0 and 180 degrees, wherein the series of pulses of alternating magnetic field are imposed with a pause cycle period substantially smaller than magnetic relaxation time of molecular species making up the fluid, whereby said series of pulses of alternating magnetic field with said pause cycle period generates nuclear magnetic resonance emission from moving fluid with an intensity monotonically increasing with time rate of fluid change taking place in the test mass;

c) measuring intensity $V_T$ of the nuclear magnetic resonance emission from the test mass generated by the series of pulses of alternating magnetic field with said pause cycle period;

d) determining intensity $V_B$ of nuclear magnetic resonance emission from molecular species other than the moving fluid contained in the test mass generated by the series of pulses of alternating magnetic field with said pause cycle period; and e) determining the time rate of fluid change from a differential combination of $V_T$ and $V_B$.

2. A method as set forth in claim 1 wherein $V_B$ is obtained by taking $V_T$ under a condition where the fluid change taking place in the test mass is stopped.

3. A method as set forth in claim 1 wherein $V_B$ is determined by multiplying a correction factor to $V_T$ obtained by measuring intensity of nuclear magnetic resonance emission from the test mass generated by the series of pulses with another pause cycle period substantially smaller than said pause cycle period, generating nuclear magnetic resonance emission from the molecular species other than the fluid at motion contained in the test mass.

4. A method as set forth in claim 1 wherein intensity of the nonalternating magnetic field varies in space, and the alternating magnetic field has a frequency matched to nuclear magnetic resonance frequency appropriate to local value of the intensity of the nonalternating magnetic field at the region substantially occupied by the test mass, whereby the nuclear magnetic resonance phenomena created by the alternating magnetic field is limited to the region substantially occupied by the test mass.

5. A method as set forth in claim 4 wherein $V_B$ is obtained by taking $V_T$ under a condition where the fluid change taking place in the test mass is stopped.

6. A method as set forth in claim 4 wherein $V_B$ is determined by multiplying a correction factor to $V_T$ obtained by measuring intensity of nuclear magnetic resonance emission from the test mass generated by the series of pulses with another pause cycle period substantially smaller than said pause cycle period, generating nuclear magnetic resonance emission from the molecular species other than the fluid at motion contained in the test mass.

7. A method as set forth in claim 1 wherein at least one of two factors comprising amplitude of the alternating magnetic field and duty cycle period of the pulse of the alternating magnetic field is adjusted to a value that produces tilting of the aligned nuclear magnetic moments over said a sizable angle between 0 and 180 degrees only at the region substantially occupied by the test mass, whereby the nuclear magnetic resonance phenomena created by the alternating magnetic field is limited to the region substantially occupied by the test mass.

8. A method as set forth in claim 7 wherein $V_B$ is obtained by taking $V_T$ under a condition where the fluid change taking place in the test mass is stopped.

9. A method as set forth in claim 7 wherein $V_B$ is determined by multiplying a correction factor to $V_T$ obtained by measuring intensity of nuclear magnetic resonance emission from the test mass generated by the series of pulses with another pause cycle period substantially smaller than said pause cycle period, generating nuclear magnetic resonance emission from the molecular species other than the fluid at motion contained in the test mass.

* * * * *